US007739059B2

(12) United States Patent
Bianco et al.

(10) Patent No.: US 7,739,059 B2
(45) Date of Patent: Jun. 15, 2010

(54) METHOD, SYSTEM, AND COMPUTER PROGRAM PRODUCT FOR CALCULATING THE RESIDUAL STRESS EQUILIBRIUM OF TWO CONCENTRIC CYLINDERS COLDWORKED BY A LOADING-UNLOADING EXPANSION PROCESS

(75) Inventors: Stephane Bianco, Toulouse (FR); Romain Canivenc, Toulouse (FR); Marc Sartor, Toulouse (FR)

(73) Assignee: Airbus France, Toulouse (FR)

( * ) Notice: Subject to any disclaimer, the term of this patent is extended or adjusted under 35 U.S.C. 154(b) by 0 days.

(21) Appl. No.: 11/778,325

(22) Filed: Jul. 16, 2007

(65) Prior Publication Data
US 2009/0024335 A1   Jan. 22, 2009

(51) Int. Cl.
*G06F 19/00* (2006.01)
(52) U.S. Cl. .................... 702/43; 73/760; 702/187; 702/189; 703/7
(58) Field of Classification Search .......... 73/783, 73/786, 432.1, 760, 788, 804, 865.9, 866, 73/866.4; 702/42, 1, 33, 34, 35, 41, 43, 108, 702/113, 127, 138, 140, 182, 187, 189; 324/206; 356/32; 703/6, 7
See application file for complete search history.

(56) References Cited

U.S. PATENT DOCUMENTS 4,075,268 A * 2/1978 Nolan .................... 264/138
4,332,073 A * 6/1982 Yoshida et al. ........... 29/421.1
4,800,109 A * 1/1989 Washizu ................. 428/34.9

FOREIGN PATENT DOCUMENTS

DE          4406726 A1 *  9/1995
EP          0 673 697    *  9/1995
JP          55-074829 A  *  6/1980

OTHER PUBLICATIONS

IBM Technical Disclosure Bulletin: "Making a Laminated Metal Insulation Metal Tube" vol. 13, No. 3, Aug. 1, 1970, pp. 685-686.*
Eraslan, A.N. and T. Akis, "Deformation analysis of elastic-plastic two layer tubes subject to pressure: an analytical approach", Turkish Journal of Engineering and Environmental Sciences, 2004, 28: p. 261-268.
Hsu, Y.C. and R.G. Forman, "Elastic-plastic analysis of an infinite sheet having a circular hole under pressure," Journal of Applied Mechanics, 1975, 42(June): p. 347-352.
Jahed, H., "A variable material property approach for elastic-plastic analysis of proportional and nonproportional loading, in Mechanical engineering," 1997, University of Waterloo.

* cited by examiner

*Primary Examiner*—Edward R Cosimano
(74) *Attorney, Agent, or Firm*—Oblon, Spivak, McClelland, Maier & Neustadt, L.L.P.

(57) ABSTRACT

A method, system, and computer program product for calculating the residual stress equilibrium of two elastoplastic cylinders coldworked by expansion to obtain interference fit. The deformation state due to an internal expansion load applied to an inner cylinder that will result in interference of the inner cylinder with the outer cylinder can be calculated. The deformation state due to an unloading of the internal expansion load that will result in assembly of the inner cylinder and the outer cylinder can be calculated. The residual stresses, residual displacement and residual strains in the inner cylinder and the outer cylinder, whether they are eventually interference fitted or not, can all be calculated and recorded.

22 Claims, 8 Drawing Sheets

200 LOADED STATE DATA
*useful for the boundary conditions of the unloading stage*

FROM 133, Figure 4

FROM 600, Figure 4

UNLOADING STEP 300

- 310 Initial no-contact calculculation
  - Procedure for inner cylinder
  - Procedure for outer cylinder

- 320 Existence of $r_c^U$?
  - NO → NON-ASSEMBLED State calculation 610
    - Procedure for inner cylinder
    - Procedure for outer cylinder
  - YES →

ITERATIVE LOOP 330 — For $r_c^U$ calculation
- 331 Initial conditions (I.C.)
- 332 Procedure for inner cylinder / Procedure for outer cylinder
- 333 Pressure balance at $r_c^U$?
  - NO → 334 I.C. modification (loops back)
  - YES →

400 UNLOADED STATE DATA
*for consistent residual state*

SUMMATION 500
Sum of the load state data and the unloaded state data

700 RESIDUAL STATE DATA

Nomenclature:

| | |
|---|---|
| Δ | increment |
| E | related to fully elastic deformations |
| ε | numerical constant |
| p | pressure |
| P | related to fully plastic deformations |
| PE | related to elastoplastic deformations |
| r | radius |
| u | displacement |

*Superscripts*

| | |
|---|---|
| L | related to loading step |
| R | related to residual state |
| U | related to unloading step |

*Subscripts*

| | |
|---|---|
| c | contact |
| a | inner radius |
| b | outer radius |
| i | inner cylinder |
| o | outer cylinder |

METHOD, SYSTEM, AND COMPUTER PROGRAM PRODUCT FOR CALCULATING THE RESIDUAL STRESS EQUILIBRIUM OF TWO CONCENTRIC CYLINDERS COLDWORKED BY A LOADING-UNLOADING EXPANSION PROCESS

BACKGROUND OF THE INVENTION

1. Field of the Invention

The present invention relates to a method, system, and computer program product for assessing whether an inner cylinder that initially achieves a clearance fit with an outer cylinder will assemble with the said outer cylinder after an expansion process has occurred. The present invention also relates to a method, system, and computer program product for calculating a residual stress state of the two cylinders subsequent to applying an internal expansion load to the inner cylinder and then releasing the internal expansion load.

2. Description of the Related Art

In order to protect borings from wear and fatigue, a solution has been to install rings by various processes such as force fitting or cold expansion. When assembling, for example, a ring inside the boring of a receiving part, one is primarily concerned with moderating stress concentration in the edge of the boring by creation of a compressive field of residual stresses. However, the variety of the geometries, the potential use of two different materials, uncertainties due to the dimensional tolerances, and the relative importance of the induced deformations can render the study of the factors which influence this otherwise technically simple process quite difficult.

A great deal of work has been completed on problems relating to loading thick cylinders, hooping or expansion of borings.

However, to date, no analytical study sufficiently treats the residual stress equilibrium of two free to slip concentric cylinders coldworked by a loading-unloading expansion process.

SUMMARY OF THE INVENTION

It is an object of this invention to develop a method for determining a residual stress state of two cylinders that initially achieves a clearance fit and then undergo an expansion process. The method can include calculating the deformation state due to an internal expansion load that will result in the interference of an inner cylinder and an outer cylinder. The method can also include calculating the deformation state due to an unloading of the internal expansion load that will result in assembly of the two cylinders. According to the method, the residual stresses, residual displacement and residual strains in the two cylinders can all be calculated and recorded.

In another non-limiting embodiment of the present invention, the calculating whether applying the internal expansion load to the inner cylinder will result in the interference of the two cylinders includes comparing a first boundary location of the initial interior diameter of the outer cylinder with a second boundary location of the external diameter of the inner cylinder subjected to interior displacement by the application of the internal expansion load.

In another non-limiting embodiment of the present invention, the calculating whether unloading the internal expansion load will result in assembly of the two cylinders includes separately calculating a first total displacement of the external diameter of the inner cylinder and a second total displacement of the interior diameter of the outer cylinder.

In another non-limiting embodiment of the present invention, the initial calculation of conditions of the internal expansion load can include calculating a deformation of the inner cylinder based on first piece boundary conditions and calculating a deformation of the outer cylinder based on receiving part boundary conditions. The first radial stress of the inner cylinder and the second radial stress of the outer cylinder can be compared, and if the difference between the first radial stress and the second radial stress is not less than a predetermined value, an iterative loop can be performed until the difference between the first radial stress and the second radial stress is less than the predetermined value. In this example, calculating a deformation of the inner cylinder includes calculating stresses or displacements in the inner cylinder, and calculating a deformation of the outer cylinder includes calculating stresses or displacements in the outer cylinder.

In another non-limiting embodiment of the present invention, an iterative loop can include the steps of changing the values of the inner cylinder boundary conditions and the outer cylinder boundary conditions used in the calculating a deformation of the inner cylinder and the calculating a deformation of the outer cylinder, repeating the calculation of a deformation of the inner cylinder and the calculation of a deformation of the outer cylinder based on the changed values of the inner cylinder boundary conditions and the outer cylinder boundary conditions. The iterative loop can also include repeating the comparison of the first radial stress of the inner cylinder with the second radial stress of the outer cylinder.

In another non-limiting embodiment of the present invention, the inner cylinder boundary conditions and the outer cylinder boundary conditions used in the calculating initial conditions of the unloading of the internal expansion load directly depend on results of the calculated initial conditions of the applying of the internal expansion load.

The method according to the present invention may also be implemented in, but is not limited to, a system or computer program product.

Another non-limiting embodiment of the present invention includes a system for determining a residual stress state of an assembly formed by an interference fitting process. The system can include means for calculating a loading step of the fitting process will result in interference of an inner cylinder with an outer cylinder. The system can also include means for calculating whether an unloading step of the fitting process will result in assembly of the two cylinders. In addition, the system can further include means for calculating a residual stress state in the two cylinders, and means for recording the residual stress state of said two cylinders.

Another non-limiting embodiment of the present invention relates to a method for determining a residual stress state of each cylinder at the end of the process including the loading and the unloading steps. The method can also include calculating a first assembly step of applying an internal expansion load to the inner cylinder will result in interference of the two cylinders. The method can also include calculating a second assembly step of unloading the internal expansion load will result in assembly of the two cylinders. In addition, the method can further include calculating residual stress state data in each cylinder; and recording said residual stress state data of said two cylinders.

One example embodiment of the method, system, and computer program product for calculating can establish the residual data fields of the inner cylinder and the outer cylinder whether or not they achieve an interference fit.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Referring now to the drawings, wherein like reference numerals designate identical or corresponding parts throughout the several views.

Figure 1:
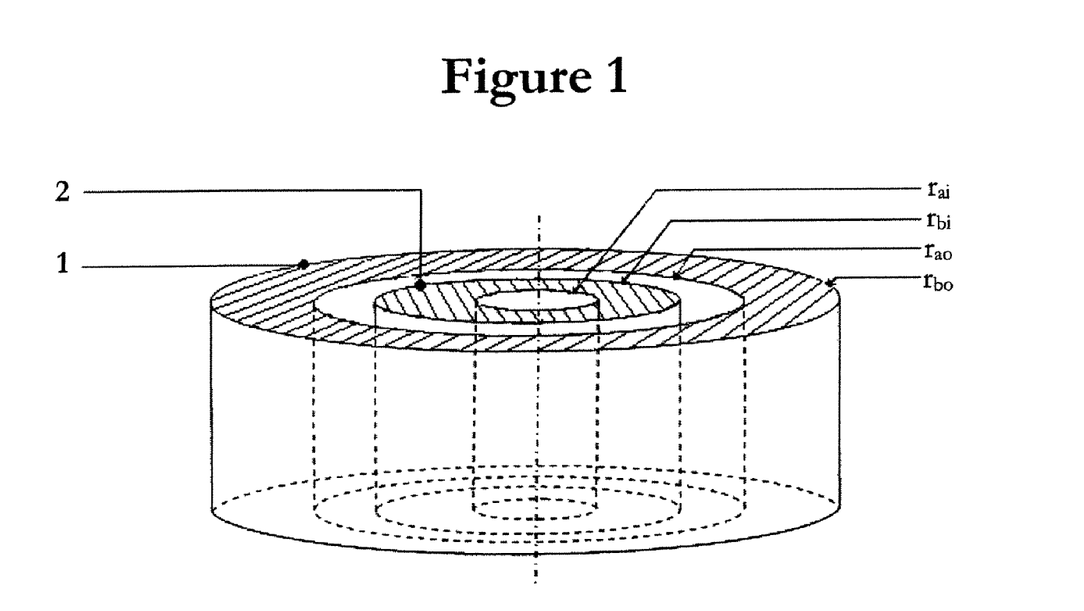
FIG. 1 is a perspective view of an example inner cylinder and an example outer cylinder in an initial state, prior to assembly.

FIG. 1 depicts an inner cylinder 2 and an outer cylinder 1 in an unassembled state. The outer cylinder 1 includes an outer radius $r_{bo}$ and an inner radius $r_{ao}$. The inner cylinder 2 includes an outer radius $r_{bi}$ and an inner radius $r_{ai}$. In order to assemble the inner cylinder 2 and the outer cylinder 1, the inner cylinder 2 is subjected to an internal expansion that can be, for example pressure or displacement driven. This boundary condition on the inner cylinder 2 may reduce the initial radial clearance between the two cylinders, $r_{ao}-r_{bi}$ to zero, and may cause deformation of the outer cylinder 1.

In proportion to the amount of deformation, each cylinder is subjected to fully elastic strains (E state), partial plastic-elastic strains (PE state) or fully plastic strains (P state). There is no combination of these states for inner cylinder 2 and outer cylinder 1 that guarantee a residual assembled state.

Figure 3:
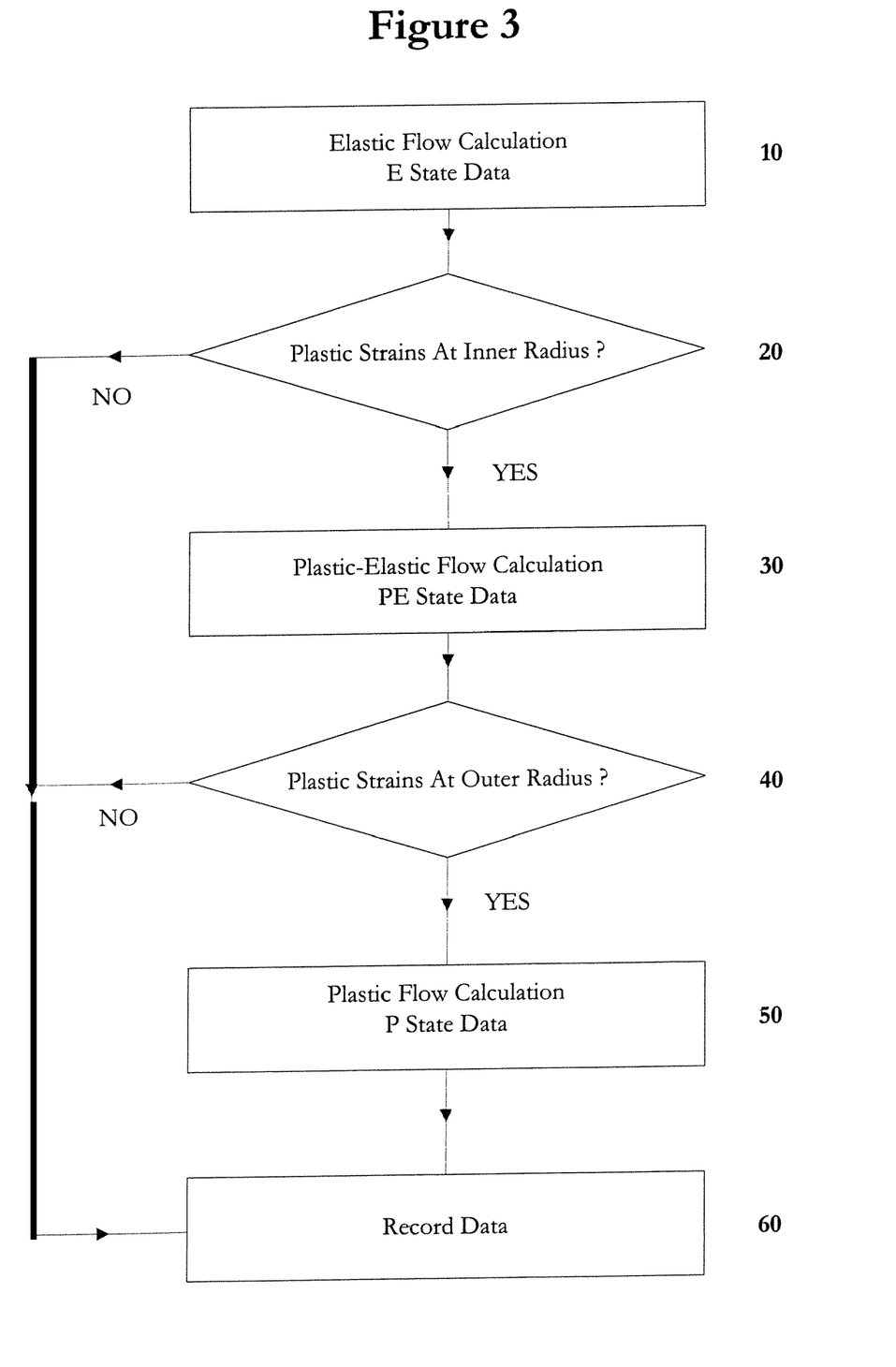
FIG. 3 is a flow chart illustrating an example procedure included in an example method of the present invention.

The deformation of the respective cylinders can be considered at each of two steps of the assembly process: (1) the loading step of internally expanding the interior of the inner cylinder 2, and (2) the unloading step of relaxing the internal expansion of the inner cylinder. As an example, FIG. 3 illustrates a procedure for determining the deformation states of each cylinder reached at the end of the two steps of the expansion process. This procedure includes the analytical analysis of the miscellaneous states (E, PE, P). As illustrated in FIG. 3, each procedure begins by calculating the elastic flow data at step 10. Following this calculation, step 20 checks whether there are plastic strains at the inner radius of the respective cylinder. If there are no plastic strains at the inner radius, the flow is considered to be elastic, and the results are recorded at step 60. However, if there are plastic strains at the inner radius of the cylinder, step 30 calculates the plastic-elastic flow data, and step 40 checks whether there are plastic strains at the outer radius of the cylinder. If there are no plastic strains at the outer radius of the cylinder, the flow is considered to be elastoplastic, and the results are recorded at step 60. However, if there are plastic strains at the outer radius of the cylinder, the flow is considered to be plastic, and step 50 calculates the plastic deformation data. The results of step 50 are then recorded at step 60.

Obtaining accurate data on the deformation of the cylinders at the end of each step can assist in diagnosing whether the assembly of the two cylinders will be successful. For instance, obtaining $u(r_{bi})<(r_{ao}-r_{bi})$ at the end of the loading step comes out to a no-interference situation, even if the inner cylinder experiences PE or P states. Obtaining the E state for the inner cylinder at the end of the loading step indicates that the two cylinders will not assemble, even if the two parts interfere, i.e. $u(r_{bi})>(r_{ao}-r_{bi})$. Further, when the inner cylinder interferes with the outer cylinder and reaches at least the PE state at the end of the loading step, both cylinders may form an assembly once the inner cylinder internal boundary condition is disabled (unloading step). The material may reach the elastoplastic state in both loading and unloading steps. The no-assembly situation occurs when material behaviour, geometrical data or boundary conditions do not allow both cylinders to assemble after the unloading step even though the outer cylinder may have undergone deformations during the loading step.

Figure 2:
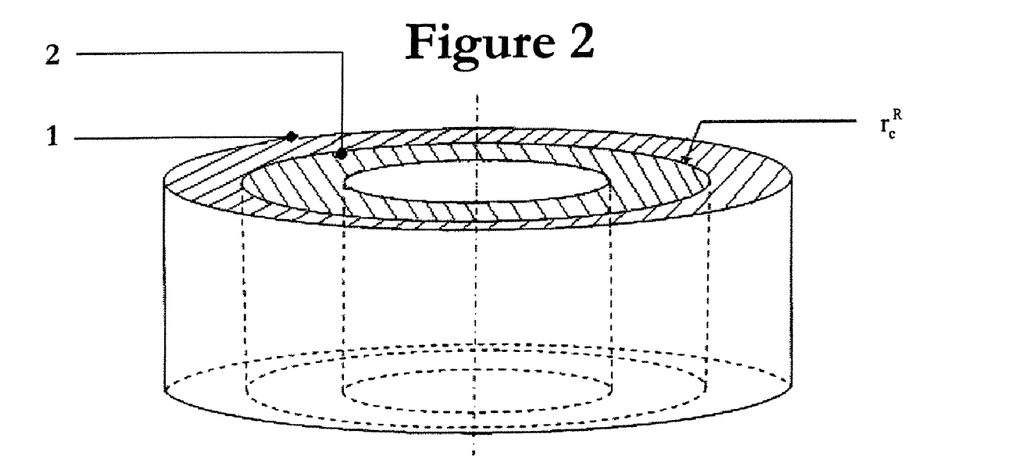
FIG. 2 is a perspective view of an example inner cylinder assembled with an example outer cylinder in a residual state.

The contact between the two cylinders following the loading step is geometrically defined by a radius noted $r_c^L$. If the inner cylinder preserves the contact with the outer cylinder during the unloading step, the contact is geometrically defined by a radius noted $r_c^U$. A global algorithm used in the present invention is based on assumption that the sum of the deformed state calculated for the loading step and of the deformed state calculated for the unloading step equals the residual deformed state. If the inner cylinder 2 is assembled in the outer cylinder 1, the contact is geometrically defined by a radius noted $r_c^R$, as can be seen in FIG. 2.

Figure 4:
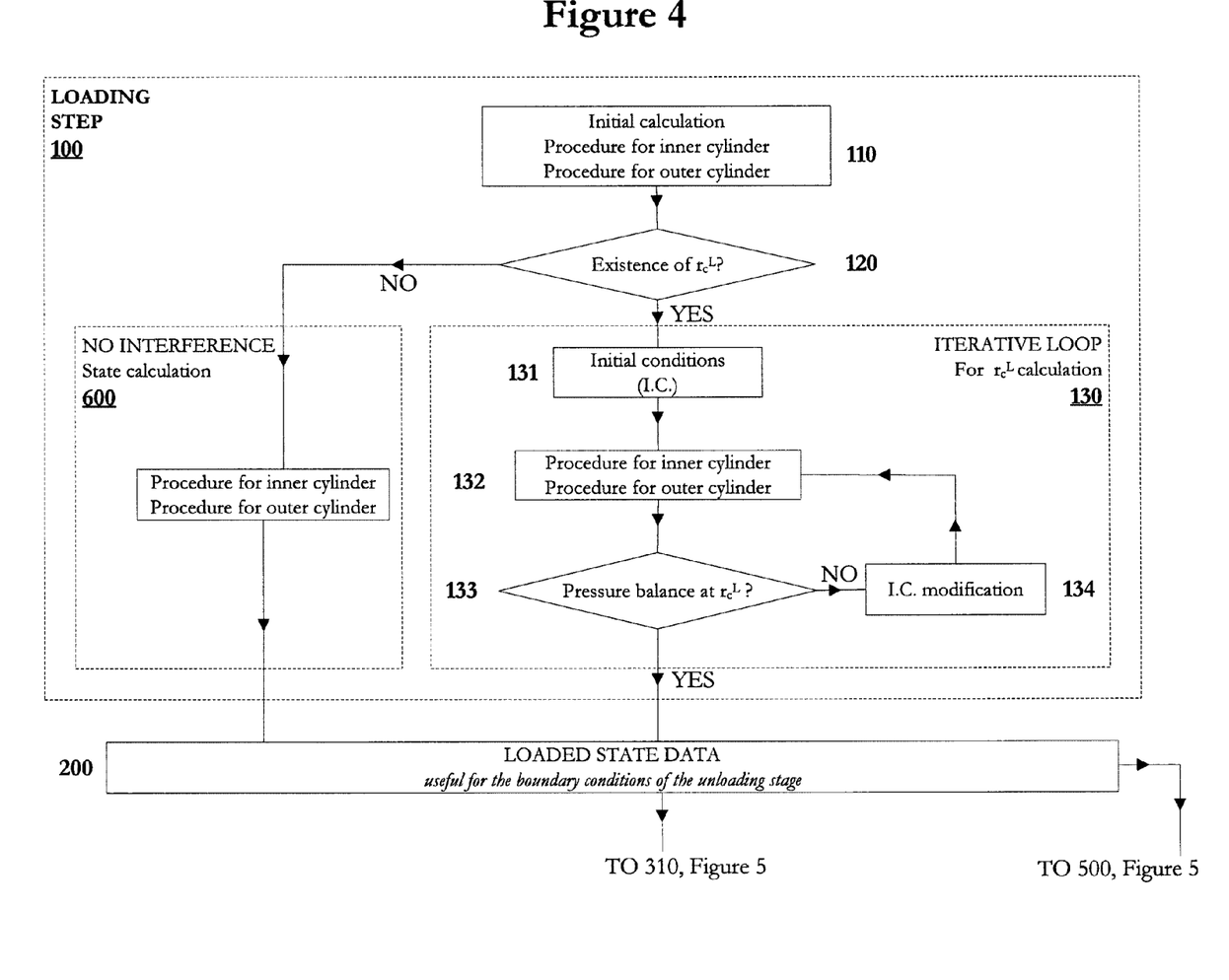
FIGS. 4-5 are flow charts illustrating an overview of the example method.
Figure 5:
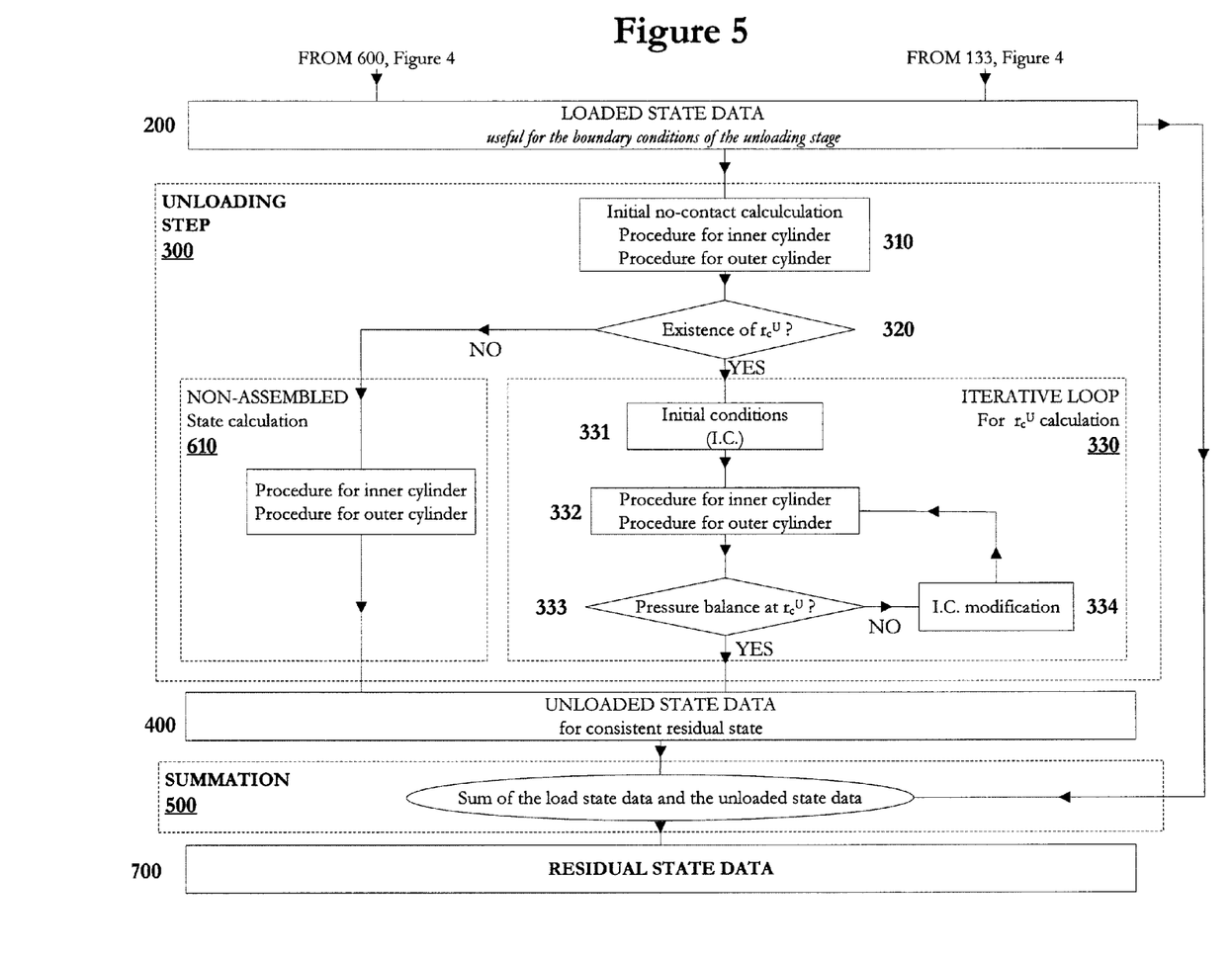

FIGS. 4 and 5 are flow charts illustrating an overview of an example method according to the present invention. The example method begins at the loading step 100, where the internal expansion of the inner cylinder is analyzed. Analysis begins with step 110, where preliminary calculations are performed, which will be discussed in greater detail below. Step 120 then checks the results of the preliminary calculations performed at step 110 to confirm whether the loading can result in the external diameter of the inner cylinder making contact with the interior diameter of the outer cylinder. In other words, step 120 checks whether $r_c^L$ exists. If $r_c^L$ does not exist, an instance of no interference is noted at step 600. However, if $r_c^L$ exists, the iterative loop 130 for determining an ideal $r_c^L$ is performed.

The iterative loop 130 begins by entering the initial conditions at step 131. Step 132 performs calculation thanks to the procedure described above with reference to FIG. 3 for the two cylinders. From the results of step 132, step 133 determines whether the loading will result in a continuity of pressure at $r_c^L$. In effect, step 133 checks whether the interference pressures between the two cylinders are balanced. If there is a continuity of pressure at $r_c^L$, the loading state is known, and that information is passed to step 200. If there is not continuity of pressure at $r_c^L$, step 134 modifies the initial conditions, and returns the results to step 132. The iterative loop continues until there is continuity of pressure at $r_c^L$ and the loading conditions can be passed to step 200.

Step 200 passes the known loading conditions to step 500, which will be discussed below, and to the analysis of the unloading step 300, as shown in FIG. 5. The analysis of the unloading step 300 begins at step 310, which makes separate calculations for the two cylinders and assumes that the two cylinders are not in contact. Step 320 then checks the results of step 310 to confirm whether the unloading step can result in the external diameter of the inner cylinder making contact with the interior diameter of the outer cylinder. In other words, step 320 checks whether an $r_c^U$ exists. If $r_c^U$ does not exist, an instance of No Assembly is noted at step 610. However, if $r_c^U$ exists, the iterative loop 330 for determining an ideal $r_c^U$ is performed.

The iterative loop 330 begins by entering the initial conditions at step 331. Step 332 performs the procedure described above with reference to FIG. 3 for the two cylinders. From the results of step 332, step 333 determines whether the loading will result in a continuity of pressure at $r_c^U$. If there is a continuity of pressure at $r_c^U$, the unloading state is known, and that information is passed to step 400. If there is not continuity of pressure at $r_c^U$, step 334 modifies the initial conditions, and returns the results to step 332. The iterative loop continues until there is continuity of pressure at $r_c^U$ and the unloading step conditions can be passed to step 400.

Step 400 passes the known unloading state results to Step 500. Step 500 sums the known loading phase results from step 200 and the known unloading phase results from step 400. The resulting residual displacement, residual stresses and residual strains of the two cylinders are then reported at step 700. In one example, the method can establish the residual data fields of the inner cylinder and the outer cylinder whether or not they achieve an interference fit.

Figure 6:
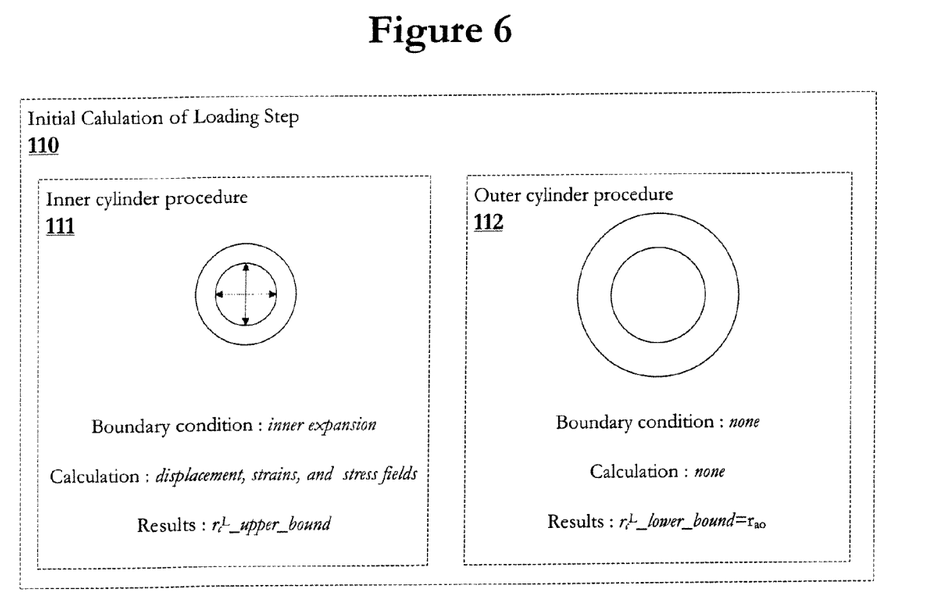
FIG. 6 illustrates example initial calculations of the loading step of the example method.
Figure 7:
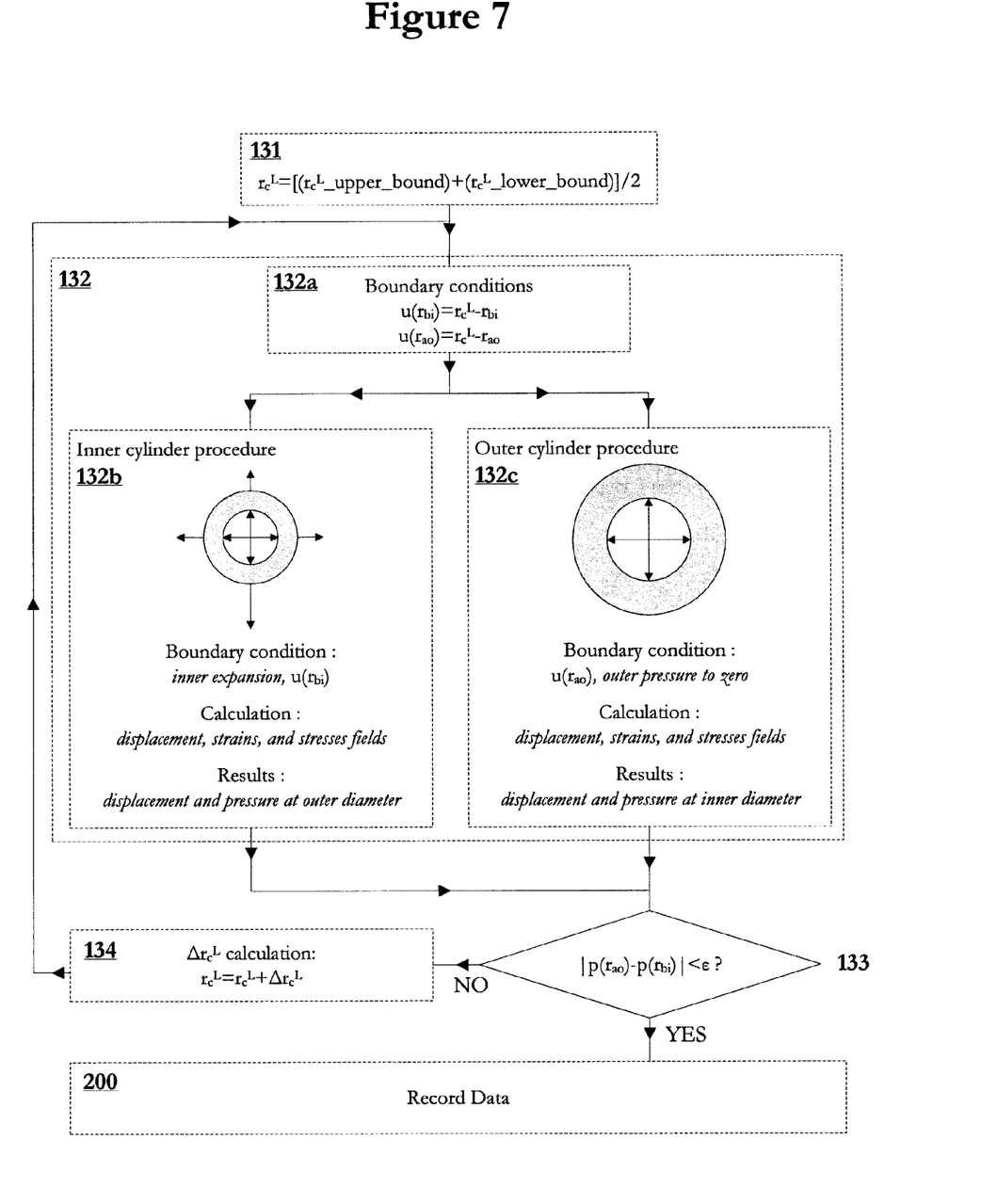
FIG. 7 is a flow chart of the example method performed for the loading step.

Each phase will now be discussed in greater detail, beginning with the loading phase. FIGS. 6 and 7 illustrate an example method of the analyzing the loading step in greater detail. As described above, the iterative process of the example method varies the radius $r_c^L$ in order to balance the interference pressures between the two cylinders. The radius $r_c^L$ can be limited for the purposes of the iterative process to a lower limit of the initial interior diameter of outer cylinder $r_{bi}$ and an upper limit of the external diameter of the inner cylinder subjected only to a desired interior displacement. The comparison of these two boundary conditions makes it possible to detect if, as of the loading phase, the process will lead to interference of the two cylinders. These calculations are performed at step 110, shown in detail in FIG. 6.

As illustrated in FIG. 6, step 110 includes performing the procedure described above with reference to FIG. 3 for the inner cylinder at 111 and for the outer cylinder at 112. At 111, the boundary condition of inner expansion is assumed and displacement, strains and stresses fields are calculated. In addition, this step can be used to determine a radius $r_c^L$_upper_bound. At 112, there are assumed to be no forces acting on the boundaries of the outer cylinder, and the radius $r_c^L$_lower_bound is determined. If $r_c^L$_upper_bound is smaller than $r_c^L$_lower_bound, the outer cylinder will not be subjected to any deformation and will not result in assembly of the two cylinders. The loading stress state of the inner cylinder can be calculated.

However, if $r_c^L$_upper_bound is greater than $r_c^L$_lower_bound, the inner expansion of the inner cylinder causes the deformation of the outer cylinder. The initial value of $r_c^L$ could be any value >$r_c^L$_lower_bound and <$r_c^L$_upper_bound for instance $r_c^L$ is initialized with the value $[(r_c^L$_upper_bound$)+(r_c^L$_lower_bound$)]/2$ as shown in step 131 of FIG. 7. The boundary conditions are sent to step 132, where the procedure described above with reference to FIG. 3 for the inner cylinder and the outer cylinder are performed. Step 132a shows that the boundary conditions are determined by the relationships $u(r_{bi})=(r_c^L-r_{bi})$; and $u(r_{ao})=(r_c^L-r_{ao})$. As shown in step 132b of FIG. 7, the calculation of the deformation of the inner cylinder assumes the boundary conditions of inner expansion and displacement at its outer radius, $u(r_{bi})$ when performing the procedure described above with reference to FIG. 3. As shown in step 132c of FIG. 7, the calculation of the deformation of the outer cylinder assumes the boundary conditions of displacement at its inner radius, $u(r_{ao})$, and outer pressure is equal to zero when performing the procedure described above with reference to FIG. 3.

The results of these calculations are sent to step 133, where it is determined whether the difference between the radial pressure on the inner cylinder, $p(r_{bi})$, and the radial pressure on the outer cylinder, $p(r_{ao})$, are less than an acceptable value epsilon. If the difference between the radial stresses of the two cylinders is less than an acceptable value epsilon, then the results of the known displacements and stresses are recorded at step 200. If not, the contact radius $r_c^L$ is calculated within an iterative loop that balances the interference pressure between the two cylinders.

As $r_c^L=r_{bi}+u(r_{bi})=r_{ao}+u(r_{ao})$; one can obtain $u(r_{bi})=r_c^L-r_{bi}$ & $u(r_{ao})=r_c^L-r_{ao}$. Step 134 in FIG. 7 makes an incremental change $\Delta r_c^L$ to the value of $r_c^L$ and sends the modified initial conditions to step 132a. This loop continues until it is determined that the difference between the radial pressure on the inner cylinder, $p(r_{bi})$, and the radial pressure on the outer cylinder, $p(r_{ao})$, are less than the acceptable value epsilon.

The unloading phase is different from the loading phase in several ways. For instance, the unloading phase has a smaller initialization because the behavior of the loading limits that of relaxing. With respect to evaluating whether assembly will occur, unlike the loading phase, determining that there will be deformation of the outer cylinder does not guaranty assembly of the two cylinders once the process is complete. Additionally, the unloading phase can make it possible by summation to obtain a coherent residual radial stress field.

Figure 8:
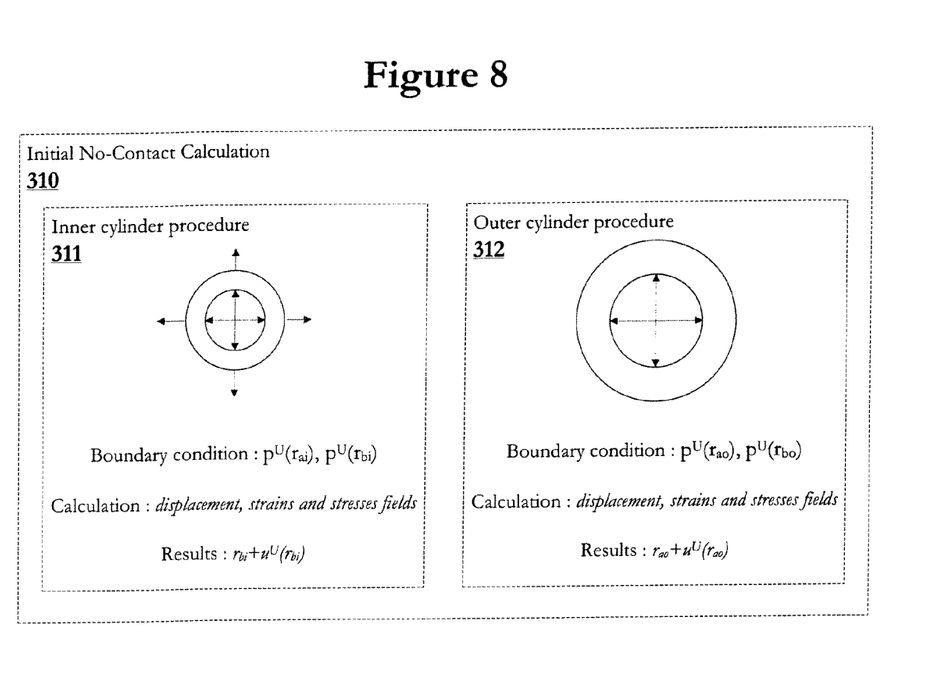
FIG. 8 illustrates example initial calculations of the unloading step of the example method.

FIG. 8 illustrates the initial calculation that is performed to determine whether the unloading step will result in assembly between the two cylinders. To make this calculation, it is assumed that the inner cylinder and the outer cylinder do not preserve contact after the unloading step. The following boundary conditions are applied: $p^U(r_{ai})=-p^L(r_{ai})$; $p^U(r_{bi})=-p^L(r_{bi})$; $p^U(r_{ao})=-p^L(r_{ao})$; and $p^U(r_{bo})=-p^L(r_{bo})=0$. These boundary conditions are used in performing the procedure described above with respect to FIG. 3 for the two cylinders at steps 311 and 312, respectively. Step 311 can be used to determine $r_{bi}+u^U(r_{bi})$, and step 312 can be used to determine $r_{ao}+u^U(r_{ao})$. If $r_{bi}+u^U(r_{bi})<r_{ao}+u^U(r_{ao})$ the inner cylinder and the outer cylinder will not assemble.

If $r_{bi}+u^U(r_{bi})>r_{ao}+u^U(r_{ao})$ the inner cylinder and the outer cylinder will assemble. The initial value of $u(r_{bi})$ could be any value <0 and >$-u^L(r_c^L)$ for instance $u(r_{bi})$ is initialized with the value $-u^L(r_c^L)/2$ as shown in step 331 of FIG. 9. These initial boundary conditions are sent to step 332 in FIG. 9, where the procedure described above with respect to FIG. 3 is performed for the two cylinders. Step 332a shows that the boundary conditions determined by the relationships $u(r_{bi})=u(r_{bi})$ and $u(r_{ao})=u(r_{bi})$. $u(r_{bi})$ is initialized in step 331 and updated in step 334. As shown in step 332b of FIG. 9, the calculation of the deformation of the inner cylinder assumes the boundary conditions of pressure on the inner radius, $p^U(r_{ai})$, and outer displacement when performing the procedure described above with reference to FIG. 3. As shown in step 332c of FIG. 9, the calculation of the deformation of the outer cylinder assumes the boundary conditions of inner displacement and $u(r_{ao})$, and outer pressure is equal to zero, $p^U(r_{bo})=0$, when performing the procedure described above with reference to FIG. 3.

Figure 9:
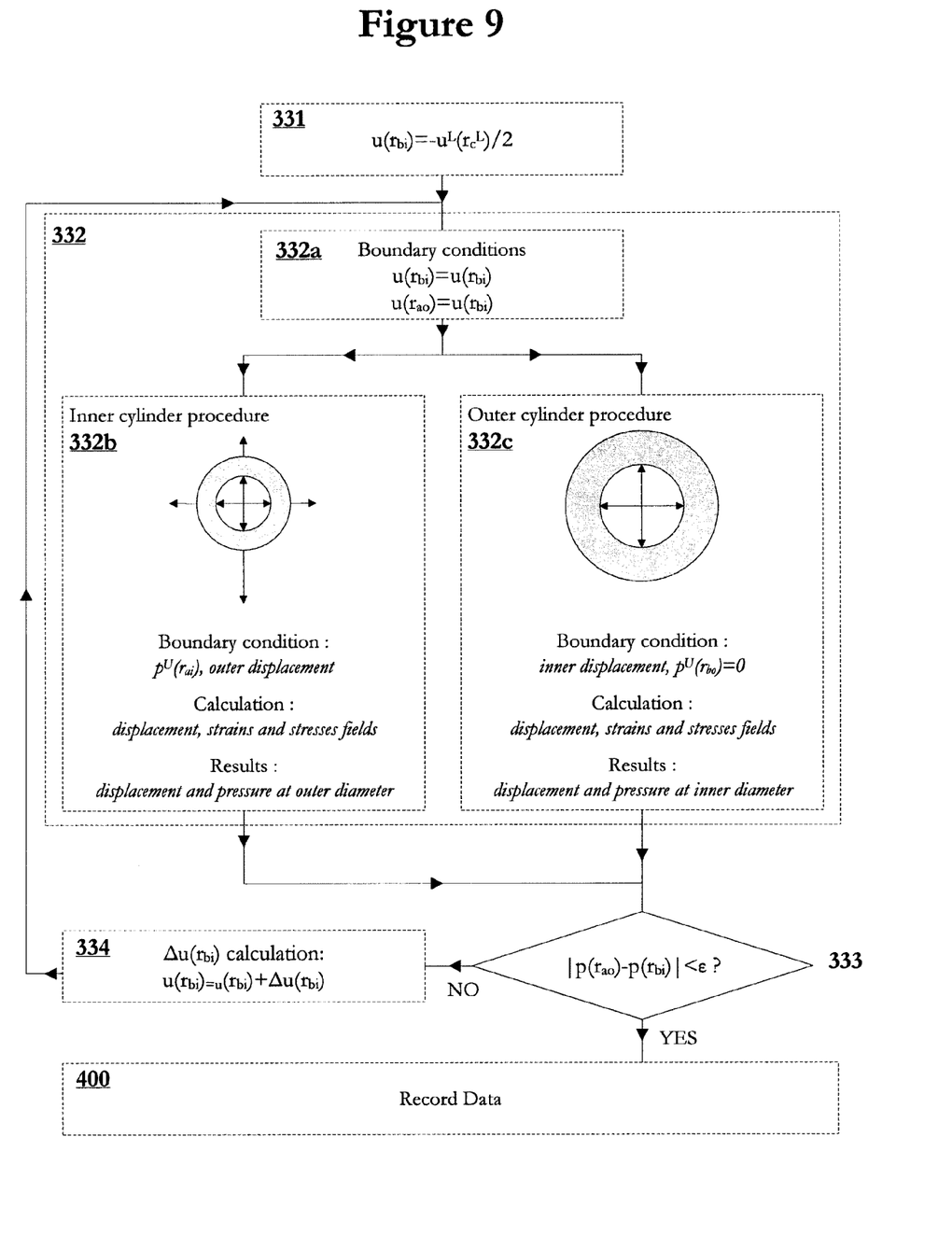
FIG. 9 is a flow chart of the example method performed for the unloading step.

The results of these calculations are sent to step 333, where it is determined whether the difference between the radial pressures of the inner cylinder and the outer cylinder are less than an acceptable value epsilon. If the difference between the radial pressures of the inner cylinder and the outer cylinder are less than an acceptable value epsilon, then the results of the known displacements and pressures are recorded at step 400. However, if the difference between the radial pressures of the inner cylinder and the outer cylinder are greater than an acceptable value epsilon, step 334 makes an incremental change $\Delta u(r_{bi})$ to the value of $u(r_{bi})$ as shown in step 334, and these new initial boundary conditions are returned to step 331.

The results of the loading phase and the unloading phase are then summed to obtain the residual stresses, residual displacement and residual strains of each cylinder. The method can establish the residual data fields of the inner cylinder and the outer cylinder whether or not they achieve an interference fit.

In another example, the method may be implemented in a computer program product that can assist in calculating a residual stress state of an assembly formed by an interference fit. The computer program product can be based on an analytical calculation and a digital model, such as the one described above, that takes into account the dimensional parameters of a part to be installed in a boring by cold working, an initial boring before installation, and the support part that includes the boring; the coefficients of friction between the two parts; as well as the mechanical characteristics of involved materials.

The example method can receive as inputs, but is not limited to receiving, the mechanical characteristics of the material of the outer cylinder, the mechanical characteristics of the inner cylinder, the dimensions of the tool used for expansion, the initial dimensions of the inner cylinder before expansion, the initial dimensions of the outer cylinder before expansion, the initial play between the two cylinders, the manufacturing tolerances and the coefficients of friction.

Figure 10:
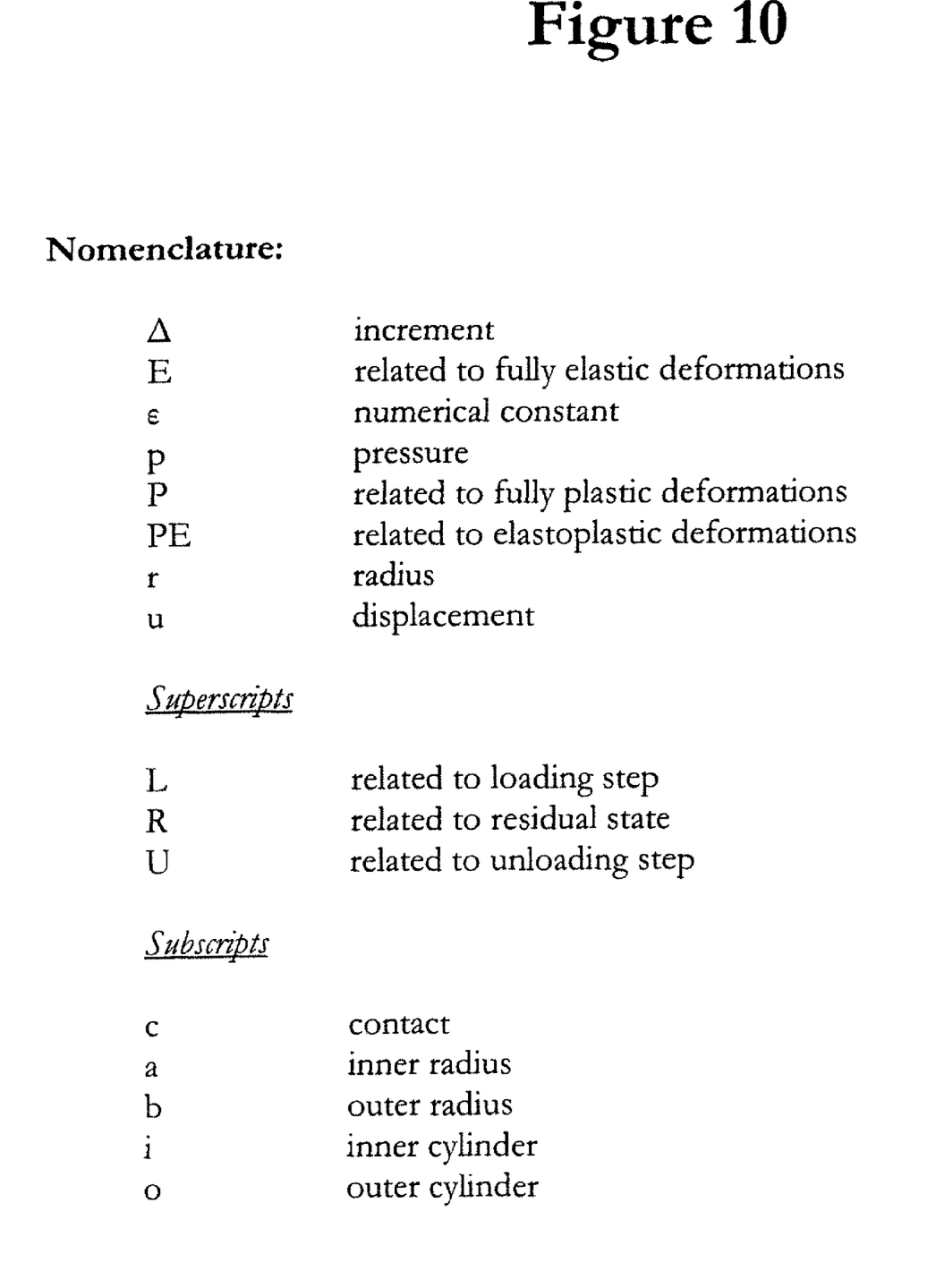
FIG. 10 lists the nomenclature of the elements depicted in FIGS. 1-9.

FIG. 10 is a list of the nomenclature of the elements that are depicted in FIGS. 1-9.

The example method can output, but is not limited to outputting, the residual stresses, strains and displacement data fields of inner cylinder, the residual stresses, strains and displacement data fields of outer cylinder, the resulting rate of interference or the residual play between the two cylinders, the effort required for assembly and the effort required to dismantle the assembly of inner cylinder and outer cylinder.

The inventive method conveniently may be implemented using a conventional general purpose computer, a handheld device that includes a microprocessor, or microprocessor programmed according to the teachings of the present invention, as will be apparent to those skilled in the computer art. Appropriate software can readily be prepared by programmers of ordinary skill based on the teachings of the present disclosure, as will be apparent to those skilled in the software art.

A general purpose computer may implement the method of the present invention. The general purpose computer may include a computer housing that houses a motherboard which contains a CPU (central processing unit), memory such as DRAM (dynamic random access memory), ROM (read only memory), EPROM (erasable programmable read only memory), EEPROM (electrically erasable programmable read only memory), SRAM (static random access memory), SDRAM (synchronous dynamic random access memory), and Flash RAM (random access memory), and other optical special purpose logic devices such as ASICs (application specific integrated circuits) or configurable logic devices such GAL (generic array logic) and reprogrammable FPGAs (field programmable gate arrays).

The computer may also include plural input devices, (e.g., keyboard, mouse, and a display card for controlling a monitor). Additionally, the computer may include a floppy disk drive; other removable media devices (e.g. compact disc, tape, and removable magneto optical media); and a hard disk or other fixed high density media drives, connected using an appropriate device bus such as a SCSI (small computer system interface) bus, an Enhanced IDE (integrated drive electronics) bus, or an Ultra DMA (direct memory access) bus. The computer may also include a compact disc reader, a compact disc reader/writer unit, or a compact disc jukebox, which may be connected to the same device bus or to another device bus.

As stated above, the system may include at least one computer readable medium. Examples of computer readable media include compact discs, hard disks, floppy disks, tape, magneto optical disks, PROMs (e.g., EPROM, EEPROM, Flash EPROM), DRAM, SRAM, SDRAM, etc.

Stored on any one or on a combination of computer readable media, the present invention includes software for controlling both the hardware of the computer and for enabling the computer to interact with a human user. Such software may include, but is not limited to, device drivers, operating systems and user applications, such as development tools.

Such computer readable media further includes the computer program product of the present invention for performing the inventive method herein disclosed. The computer code devices of the present invention can be any interpreted or executable code mechanism, including but not limited to, scripts, interpreters, dynamic link libraries, Java classes, and complete executable programs.

The invention may also be implemented by the preparation of application specific integrated circuits (ASICs) or by interconnecting an appropriate network of conventional component circuits, as will be readily apparent to those skilled in the art.

Obviously, numerous modifications and variations of the present invention are possible in light of the above teachings. It is therefore to be understood that within the scope of the appended claims, the invention may be practiced otherwise than as specifically described herein.

We claim:

1. A computer readable storage medium encoded with instructions which, when executed by a computer, cause a processor to execute a method for determining a residual stress state of two elastoplastic cylinders coldworked by expansion, said method comprising:

calculating whether applying an internal expansion load to an inner cylinder that is concentrically arranged within an outer cylinder will result in the interference of the inner cylinder with the outer cylinder, wherein an outer radius of the inner cylinder is smaller than an inner radius of the outer cylinder such that there is a clearance between the outer radius of the inner cylinder and the inner radius of the outer cylinder prior to applying the internal expansion load to the inner cylinder;

calculating whether unloading the internal expansion load will result in assembly of the inner cylinder with the outer cylinder;

calculating residual stresses, residual displacement and residual strains in the inner cylinder and the outer cylinder, wherein the residual stresses, the residual displacement and the residual strains in the inner cylinder and the outer cylinder are stresses, displacement, and strains in the inner cylinder and the outer cylinder after the internal expansion load has been unloaded; and recording said residual stresses, residual displacement and residual strains of the inner cylinder and the outer cylinder for use in selecting a ring that is to be initially clearance fitted in a receiving part and then involved in a loading-unloading process so as to install the ring in the receiving part by cold expansion.

2. A computer readable storage medium according to claim 1, wherein said calculating whether applying the internal expansion load to the inner cylinder will result in interference of the inner cylinder with the outer cylinder includes comparing a first boundary location of an initial interior diameter of the outer cylinder with a second boundary location of an external diameter of the inner cylinder subjected to interior displacement by the application of the internal expansion load.

3. A computer readable storage medium according to claim 1, wherein said calculating whether unloading the internal expansion load will result in assembly of the inner cylinder with the outer cylinder includes separately calculating a first total displacement of an external diameter of the inner cylinder and a second total displacement of an interior diameter of the outer cylinder.

4. A computer readable storage medium according to claim 1, further comprising:
calculating initial conditions of the applying of the internal expansion load and calculating initial conditions of the unloading of the internal expansion load, the calculating initial conditions of the applying of the internal expansion load or the calculating initial conditions of the unloading of the internal expansion load including:
calculating a deformation of the inner cylinder based on inner cylinder boundary conditions;
calculating a deformation of the outer cylinder based on outer cylinder boundary conditions;
comparing a first radial stress of the inner cylinder with a second radial stress of the outer cylinder; and
if a difference between the first radial stress and the second radial stress is not less than a predetermined value, performing an iterative loop until the difference between the first radial stress and the second radial stress is less than the predetermined value,
wherein calculating the deformation of the inner cylinder includes calculating stresses or displacements in the inner cylinder, and
wherein calculating the deformation of the outer cylinder includes calculating stresses or displacements in the outer cylinder.

5. A computer readable storage medium according to claim 4, wherein the iterative loop includes:
changing the values of the inner cylinder boundary conditions and the outer cylinder boundary conditions used in the calculating of the deformation of the inner cylinder and the calculating of the deformation of the outer cylinder;
repeating the calculating of the deformation of the inner cylinder and the calculating of the deformation of the outer cylinder based on the changed values of the inner cylinder boundary conditions and the outer cylinder boundary conditions; and
repeating the comparing of the first radial stress of the inner cylinder with the second radial stress of the outer cylinder.

6. A computer readable storage medium according to claim 4, wherein the inner cylinder boundary conditions and the outer cylinder boundary conditions used in the calculating initial conditions of the unloading of the internal expansion load directly depend on results of the calculating initial conditions of the applying of the internal expansion load.

7. A computer readable storage medium according to claim 4, wherein the calculating residual stresses, residual displacement and residual strains in the inner cylinder and the outer cylinder includes summing results from a calculating of a deformation state due to the applying of the internal expansion load and results from a calculating of a deformation state due to the unloading of the internal expansion load.

8. A system for determining a residual stress state of two elastoplastic cylinders coldworked by an expansion process, said system comprising:
means for calculating whether applying an internal expansion load to an inner cylinder that is concentrically arranged within an outer cylinder will result in interference of the inner cylinder with the outer cylinder, wherein an outer radius of the inner cylinder is smaller than an inner radius of the outer cylinder such that there is a clearance between the outer radius of the inner cylinder and the inner radius of the outer cylinder prior to applying the internal expansion load to the inner cylinder;
means for calculating whether unloading the internal expansion load will result in assembly of the inner cylinder with the outer cylinder;
means for calculating a residual stress state in the inner cylinder and the outer cylinder, wherein the residual stress state in the inner cylinder and the outer cylinder is a stress state in the inner cylinder and the outer cylinder after the internal expansion load has been unloaded; and
means for recording said residual stress state of the inner cylinder and the outer cylinder for use in selecting a ring that is to be initially clearance fitted in a receiving part and then involved in a loading-unloading process so as to install the ring in the receiving part by cold expansion.

9. A system according to claim 8, wherein said means for calculating whether unloading the internal expansion load will result in interference of the inner cylinder with the outer cylinder includes means for comparing a first boundary location of an initial interior diameter of the outer cylinder with a second boundary location of an external diameter of the inner cylinder subjected to interior displacement.

10. A system according to claim 8, wherein said means for calculating whether unloading the internal expansion load will result in assembly of the inner cylinder with the outer cylinder includes means for separately calculating a first total displacement of an external diameter of the inner cylinder and a second total displacement of an interior diameter of the outer cylinder.

11. A system according to claim 8, further comprising:
means for calculating initial loading step conditions and means for calculating initial unloading step conditions, the means for calculating initial loading step conditions or the means for calculating initial unloading step conditions including:
means for calculating a deformation of the inner cylinder based on inner cylinder boundary conditions;
means for calculating a deformation of the outer cylinder based on outer cylinder boundary conditions;
means for comparing a first radial stress of the inner cylinder with a second radial stress of the outer cylinder; and
means for performing an iterative loop if a difference between the first radial stress and the second radial stress is not less than a predetermined value, said iterative loop being performed until the difference between the first radial stress and the second radial stress is less than the predetermined value, wherein the means for calculating a deformation of the inner cylinder includes means for calculating stresses or displacements in the inner cylinder, and wherein the means for calculating a deformation of the outer cylinder includes means for calculating stresses or displacements in the outer cylinder.

12. A system according to claim 11, wherein the means for performing the iterative loop includes:

means for changing the values of the inner cylinder boundary conditions and the outer cylinder boundary conditions used by the means for calculating of the deformation of the inner cylinder and the means for calculating the deformation of the outer cylinder;

means for repeating the calculating of the deformation of the inner cylinder and the calculating of the deformation of the outer cylinder based on the changed values of the inner cylinder boundary conditions and the outer cylinder boundary conditions; and means for repeating the comparing of the first radial stress of the inner cylinder with the second radial stress of the outer cylinder.

13. A system according to claim 11, wherein the inner cylinder boundary conditions and the outer cylinder boundary conditions used in the means for calculating initial unloading step conditions directly depend on results of the means for calculating initial loading step conditions.

14. A system according to claim 11, wherein the means for calculating the stress state in the inner cylinder and the outer cylinder includes means for combining results from a means for calculating an unloading step deformation state with results from a means for calculating a loading step deformation state.

15. A method, implemented on a particular machine that includes a processor and a computer readable storage medium, for determining a residual stress state of two cylinders initially clearance fitted and then involved in a loading-unloading process, said method comprising:

providing an inner cylinder and an outer cylinder, such that the inner cylinder is arranged concentrically within the outer cylinder with a clearance fit;

calculating, in the processor of the particular machine, whether a first assembly step of applying an internal expansion load to the inner cylinder will result in interference of the inner cylinder with the outer cylinder;

calculating, in the processor of the particular machine, whether a second assembly step of unloading the internal expansion load will result in assembly of the inner cylinder with the outer cylinder;

calculating, in the processor of the particular machine, residual stress state data in the inner cylinder and the outer cylinder, wherein the residual stress state in the inner cylinder and the outer cylinder is a stress state in the inner cylinder and the outer cylinder after the internal expansion load has been unloaded; and recording said residual stress state data of the inner cylinder and the outer cylinder on the computer readable medium of the particular machine for use in selecting a ring that is to be initially clearance fitted in a receiving part and then involved in a loading-unloading process so as to install the ring in the receiving part by cold expansion.

16. A method according to claim 15, wherein said calculating whether the first assembly step will result in interference of the inner cylinder with the outer cylinder includes comparing a first boundary location of an initial interior perimeter of the outer cylinder with a second boundary location of an external perimeter of the inner cylinder subjected to interior displacement by the application of the internal expansion load.

17. A method according to claim 15, wherein said calculating whether the second assembly step will result in assembly of the inner cylinder with the outer cylinder includes separately calculating a first total displacement of an external perimeter of the inner cylinder and a second total displacement of an interior perimeter of the outer cylinder.

18. A method according to claim 15, further comprising:

calculating, in the processor of the particular machine, initial boundary conditions of the first assembly step and calculating initial boundary conditions of the second assembly step, the calculating initial boundary conditions of the first assembly step and the calculating initial boundary conditions of the second assembly step including:

calculating a deformation of the inner cylinder based on inner cylinder boundary conditions;

calculating a deformation of the outer cylinder based on outer cylinder boundary conditions;

comparing a first radial stress of the inner cylinder with a second radial stress of the outer cylinder; and if a difference between the first radial stress and the second radial stress is not less than a predetermined value, performing an iterative loop until the difference between the first radial stress and the second radial stress is less than the predetermined value, wherein calculating a deformation of the inner cylinder includes calculating stresses or displacements in the inner cylinder, and wherein calculating a deformation of the outer cylinder includes calculating stresses or displacements in the outer cylinder.

19. A method according to claim 18, wherein the iterative loop includes:

changing the values of the inner cylinder boundary conditions and the outer cylinder boundary conditions used in the calculating of the deformation of the inner cylinder and the calculating of the deformation of the outer cylinder;

repeating the calculating of the deformation of the inner cylinder and the calculating of the deformation of the outer cylinder based on the changed values of the inner cylinder boundary conditions and the outer cylinder boundary conditions; and repeating the comparing of the first radial stress of the inner cylinder with the second radial stress of the outer cylinder.

20. A method according to claim 18, wherein the inner cylinder boundary conditions and the outer cylinder boundary conditions used in the calculating initial conditions of the unloading of the internal expansion load directly depend on results of the calculating initial conditions of the applying the internal expansion load.

21. A method according to claim 18, wherein calculating the residual stress state data includes calculating residual stresses, residual displacement and residual strains in the inner cylinder and the outer cylinder.

22. A method according to claim 18, wherein calculating the residual stress data includes summing results from a calculating of a deformation state of the first assembly step resulting from applying the internal expansion load and results from a calculating of a deformation state of the second assembly step of unloading the internal expansion load.

* * * * *